US008564939B2

(12) United States Patent
Shreve

(10) Patent No.: US 8,564,939 B2
(45) Date of Patent: Oct. 22, 2013

(54) METHOD AND APPARATUS FOR BYPASSING THE BATTERY OF A COMPUTER

(75) Inventor: Kelley Joseph Shreve, Fredericksburg, VA (US)

(73) Assignee: Germane Systems, LLC., Chantilly, VA (US)

( * ) Notice: Subject to any disclaimer, the term of this patent is extended or adjusted under 35 U.S.C. 154(b) by 329 days.

(21) Appl. No.: 13/037,723

(22) Filed: Mar. 1, 2011

(65) Prior Publication Data

US 2012/0224312 A1    Sep. 6, 2012

(51) Int. Cl.
    *G06F 1/16*    (2006.01)
(52) U.S. Cl.
    USPC ............ 361/679.02; 361/679.01; 361/679.58; 361/679.6; 361/724; 429/96; 429/98; 429/99; 429/100
(58) Field of Classification Search
    None
    See application file for complete search history.

(56) References Cited

U.S. PATENT DOCUMENTS

| 4,713,609 | A |   | 12/1987 | Losapio et al. |
|-----------|---|---|---------|----------------|
| 5,075,182 | A | * | 12/1991 | Weber ............................... 429/1 |
| 5,148,095 | A |   | 9/1992  | Miller et al. |
| 5,528,460 | A |   | 6/1996  | Byrd |
| 5,864,462 | A | * | 1/1999  | Kao ............................ 361/679.6 |
| 6,599,657 | B1| * | 7/2003  | Pollett et al. ..................... 429/96 |
| 6,602,080 | B1| * | 8/2003  | Gu ................................... 439/82 |
| 7,608,944 | B2|   | 10/2009 | Stranberg et al. |
| 2012/0098343 | A1| * | 4/2012 | Harris et al. .................... 307/48 |

FOREIGN PATENT DOCUMENTS

JP    54-043438    4/1979

* cited by examiner

*Primary Examiner* — Anthony Q Edwards
(74) *Attorney, Agent, or Firm* — Nixon & Vanderhye P.C.

(57) ABSTRACT

A battery bypass assembly for a computer includes a battery housing which is configured to receive a battery in a battery receptacle. The assembly also includes a battery emulator which is designed to be installed in the battery receptacle of a computer motherboard. An electrical cable connects the electrical contacts of the battery receptacle in the battery housing to the corresponding terminals on the battery emulator. Once the battery emulator has been mounted in a battery receptacle of a computer motherboard, and a battery has been mounted in the battery receptacle of the battery housing, the battery will power circuits on the computer motherboard. The battery housing can be positioned in a location where it is easily accessible. As a result, the battery can be easily replaced without the need to open the housing of the computer.

18 Claims, 6 Drawing Sheets

METHOD AND APPARATUS FOR BYPASSING THE BATTERY OF A COMPUTER

BACKGROUND OF THE INVENTION

The motherboard of many computers, including personal computers, laptop computers and computer servers, have a battery receptacle for receiving a coin-shaped battery. The battery provides electrical power to a clock circuit on the motherboard or in the central processor. The clock circuit is intended to run continuously, even when the computer is turned off.

In older computers, the coin-shaped battery also provided electrical power to a memory circuit which stored basic operating software used by the computer. The application of electrical power to the memory circuit, even when the computer was turned off, was necessary to ensure that the data stored in the memory circuit was not lost. In more modern computers, this software is saved on non-volatile memory which does not require the constant application of electrical power to retain the stored data.

The batteries used to power the clock circuits and memory devices of computers have a finite lifetime. Once such a battery has lost a sufficient amount of power by running whatever devices are connected, the computer will register a fault and instruct the user to replace the battery.

FIG. 1 illustrates a typical computer motherboard 100 which includes a plurality of electrical components 102 and semiconductor chips 104 which are mounted on a printed circuit board. The motherboard 100 also includes the central processor 106 of the computer. Further, as explained above, a battery receptacle 112 is mounted on the motherboard 100. A coin-shaped battery 110 is then mounted on the battery receptacle 112.

Because the coin-shaped battery is typically received in a battery receptacle which is mounted on the computer motherboard, accessing and replacing the battery can be time consuming and difficult. In the case of a laptop or desktop computer, it is necessary to open the housing of the computer to access the computer motherboard. The user must then remove the old battery, and insert a new battery in its place. In addition to the time required to make the battery change, opening the housing of a computer and accessing and replacing the battery can subject other internal components of the computer to accidental damage.

FIG. 2 of the application illustrates a typical computer server rack 200 which holds a plurality of computer servers 202, which are mounted in the rack 200. The front face of the computer servers 202 can include handles 204 to facilitate the installation and removal of the servers 202 from the rack 200. In addition, the front faces of the servers can include access doors that cover removable memory devices 206, 208. The access doors can be opened to allow a user to insert and remove the memory devices, such as disk drives.

When it is necessary to replace a battery on the motherboard of a server mounted in a rack, as illustrated in FIG. 2, it is usually necessary to remove the server from the rack in which it is mounted. Once the server has been removed from the rack, a housing of the server must be opened, and one must access the computer motherboard and replace the battery. Thus, the time required to replace a battery in a computer server can be even longer than the time required to replace a battery in a desktop or laptop computer.

DETAILED DESCRIPTION OF PREFERRED EMBODIMENTS

Figure 1:
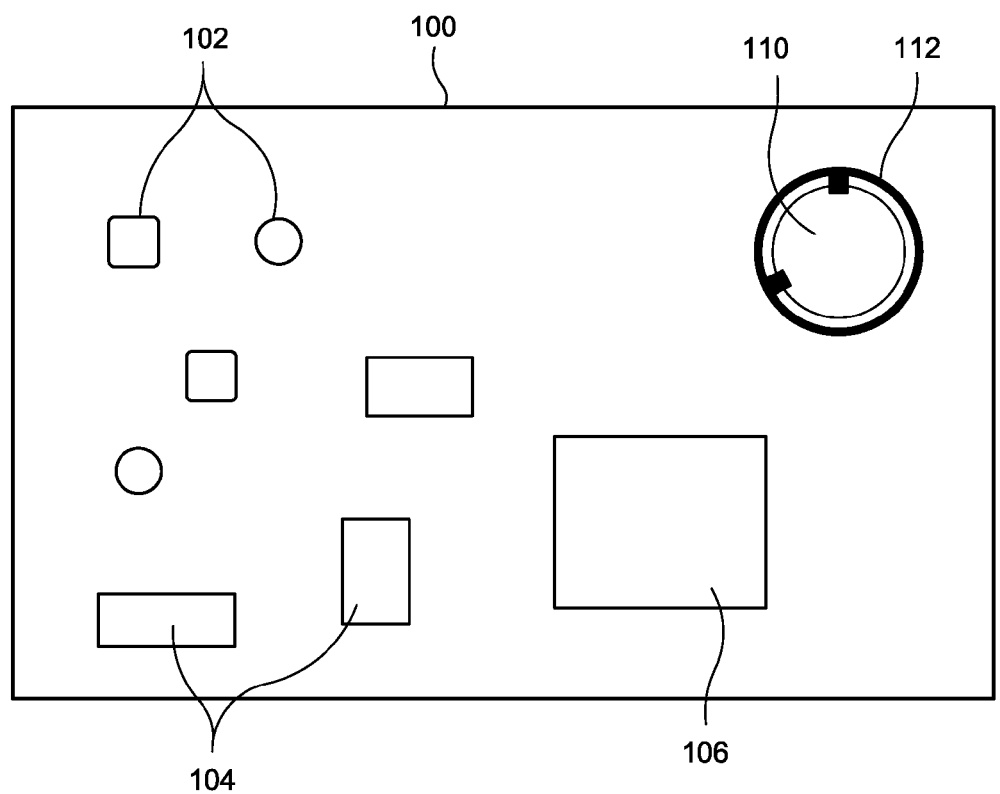
FIG. 1 is a diagram of a computer motherboard of a typical computer.
Figure 2:
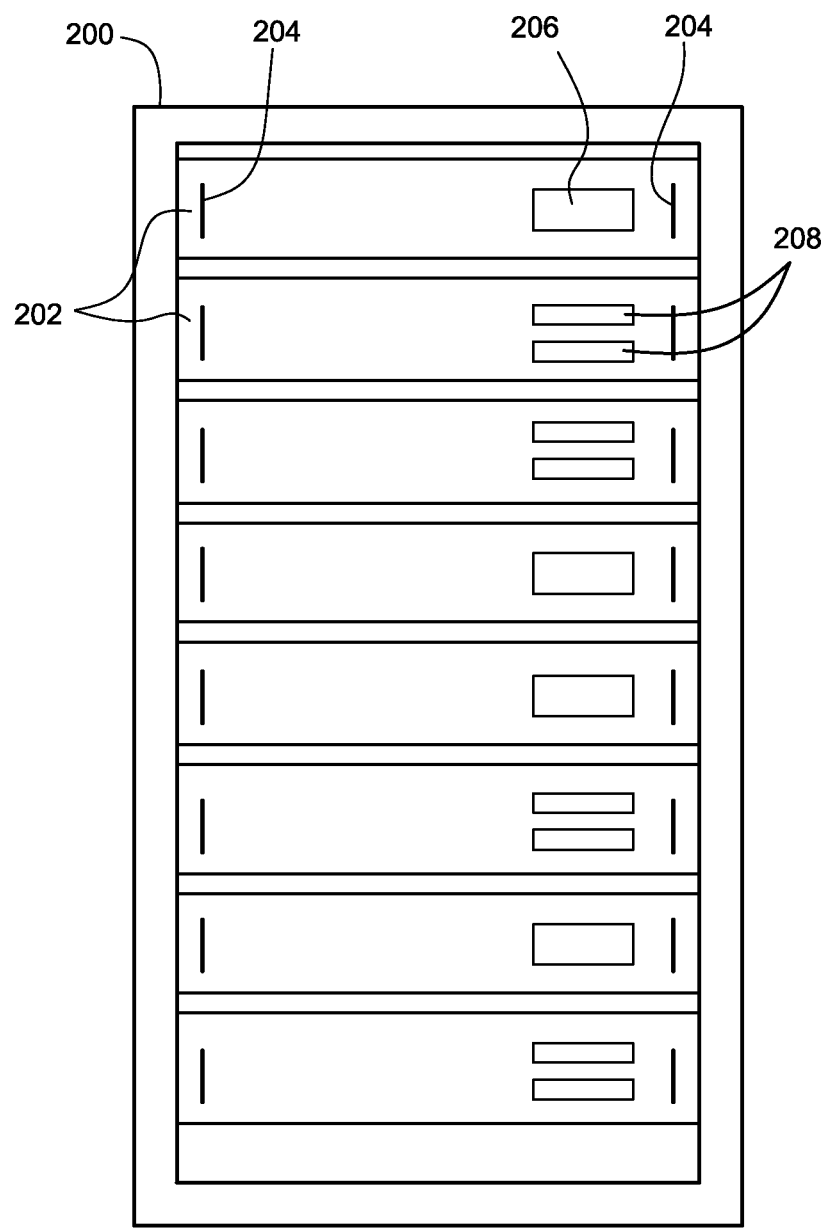
FIG. 2 illustrates a plurality of computer servers mounted in a rack.
Figure 3:
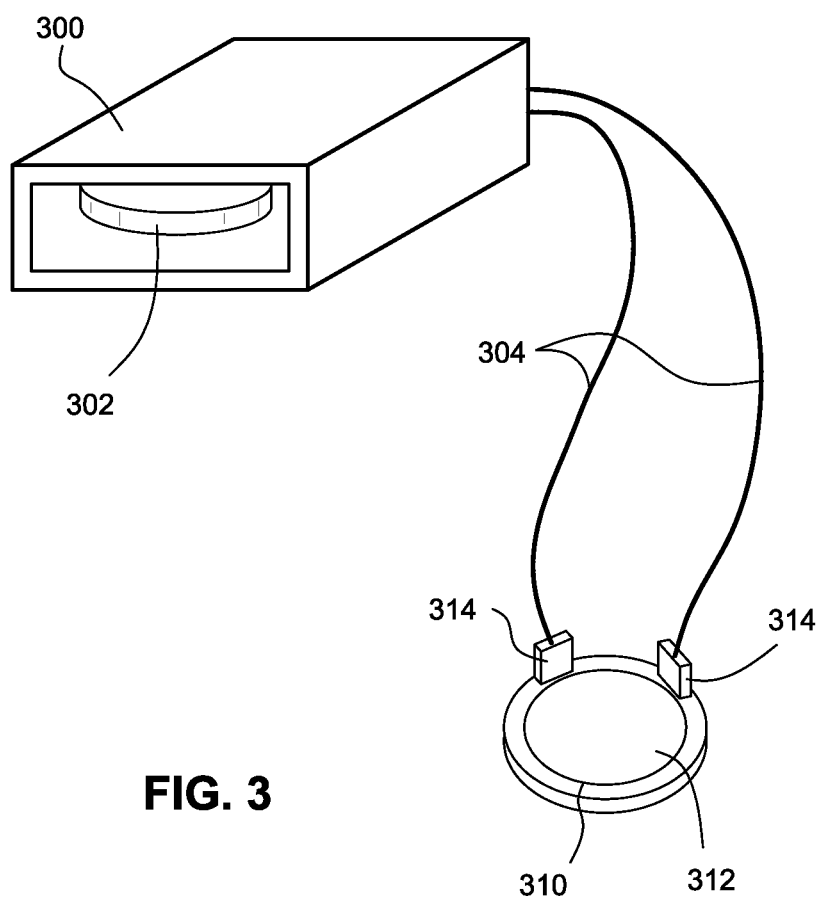
FIG. 3 illustrates a battery bypass assembly which can be used with a computer.

FIG. 3 illustrates a battery bypass assembly which can be installed in a computer to make it easier and faster to replace the battery used to power a clock circuit and/or memory devices of a computer motherboard. The battery bypass assembly includes a battery housing 300 which is configured to receive a battery 302. The assembly also includes a battery emulator 310 which is configured to be installed in a battery receptacle of a computer.

In the embodiment illustrated in FIG. 3, the battery emulator 310 is designed to have exterior dimensions which are substantially the same as a typical coin-shaped battery which would be installed in the battery receptacle of a computer. Electrical terminals 312 are provided on the opposite flat sides of the battery emulator 310. The electrical terminals 312 are located in substantially the same positions as the electrical terminals of a coin-shaped battery.

A battery receptacle is mounted inside the battery housing 300. A typical coin-shaped battery 302 is then mounted in the battery receptacle. In alternate embodiments, different shaped batteries, or a capacitor, could be located in the battery housing 300 to provide a source of electrical power.

As illustrated in FIG. 3, one or more electrical cables 304 connect the battery housing 300 to the battery emulator 310. Specifically, first ends of the electrical cables 304 are coupled to electrical contacts of the battery receptacle within the battery housing 300. The opposite ends of the electrical cables 304 are connected to the terminals 312 of the battery emulator 310. One or more connectors 314 could be used to attach the electrical cables 304 to the terminals of the battery emulator.

In the embodiment illustrated in FIG. 3, two separate electrical cables 304 are used, one to connect the negative contact of the battery receptacle in the battery housing to the negative terminal on the battery emulator 310, and the other to connect the positive electrical contact of the battery receptacle to the positive terminal on the battery emulator 310. In alternate embodiments, a single electrical cable with two conductive traces could be used. If a single electrical cable 304 is used, a single connector 314 on each end of the cable could be used to connect the cable to the battery housing 300 and the battery emulator 310.

The battery emulator 310 can be installed in a battery receptacle located on a computer motherboard, and the battery housing can be located on the computer at a location that is readily accessible to a user. When the battery housing is located so that it is readily accessible to the user, the user can more easily and quickly change the battery.

Figure 4:
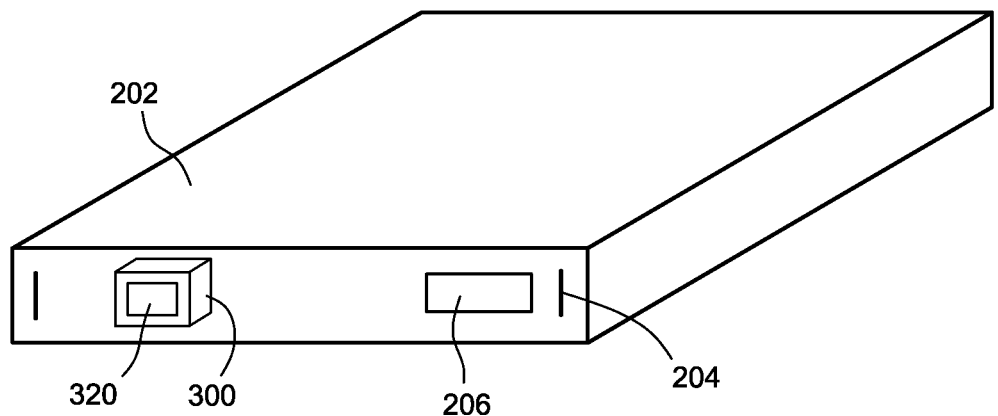
FIG. 4 illustrates a computer server which includes a battery bypass assembly.

In the embodiment illustrated in FIG. 4, a battery housing 300 is mounted on a front face of a computer server 202. An aperture 320 in the front of the battery housing 300 allows the battery to be mounted into and removed from the battery receptacle in the battery housing 300. One or more electrical cables 304 lead from the rear of the battery housing 300 to a battery emulator 310 which is installed in the battery receptacle of a computer motherboard located inside the housing of the server 202.

When it becomes necessary to replace the battery, it can be easily accomplished through the aperture 320 in the front of the battery housing 300. There is no need to remove the server 200 from the rack in which it is mounted, nor is it even necessary to open the housing of the computer server 202.

Although FIG. 4 illustrates a battery housing 300 mounted on the front face of the server housing, in alternate embodiments the battery housing could be mounted on a rear face of the server housing, or on a side surface. In still other embodiments, the battery housing 300 could be attached to the top or bottom of the server enclosure.

Figure 5:
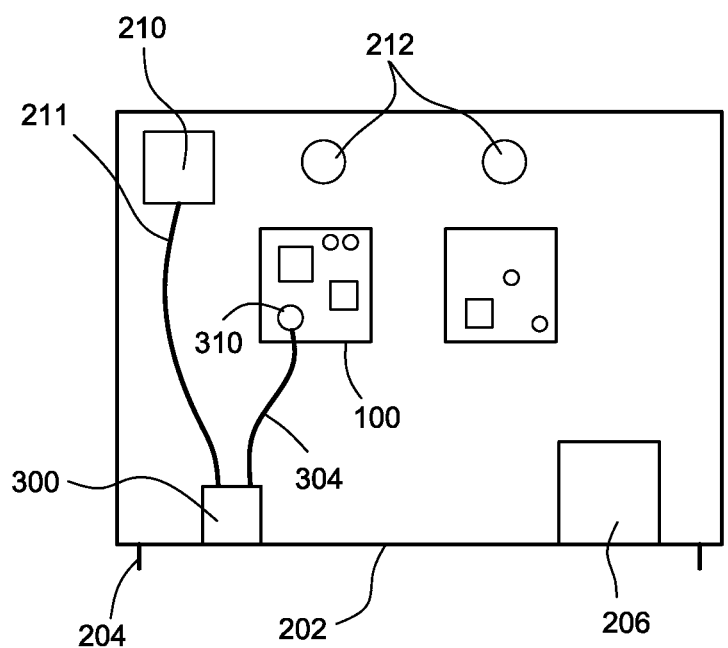
FIG. 5 illustrates a computer server which includes a battery bypass assembly.

FIG. 5 is a top view of a computer server 202 with the top cover removed. The server includes a plurality of printed circuit boards, including the motherboard 100. A plurality of cooling fans 212, a memory device 206, and a power supply 210 are also mounted inside the server.

As illustrated in FIG. 5, the battery emulator 310 is installed in the battery receptacle of the computer motherboard 100. An electrical cable 304 connects the battery emulator 310 to contacts of a battery receptacle located in a battery housing 300 that is mounted inside the front face of the server housing. As a result, power from a battery in the battery housing 300 is provided to the relevant circuits on the computer motherboard 100 via the electrical cable 304 and the battery emulator 310.

An aperture is provided on the front face of the computer server 202 to allow a user to replace the battery in the battery housing 300 without the need to remove the server from a rack, and without the need to open the housing of the server. Thus, whenever a battery has reached the end of its useful life, maintenance personnel can quickly and easily replace the battery. Because the battery housing 300 is mounted inside the housing of the server 202, it is less likely to be accidentally damaged by incidental contact than if the battery housing 300 is mounted on the outside the server housing, as illustrated in FIG. 4.

The embodiment illustrated in FIG. 5 also shows that a power cable 211 is operatively connected between the power supply 210 and the battery housing. In some embodiments, such a power cable 211 could supply power to the battery in the battery housing 300 to keep the battery charged indefinitely. Anytime that the server is operating, power from the power supply 210 would act to recharge the battery.

In alternate embodiments, the power supply 210 could also include a battery mounting portion that receives the battery. The battery mounting portion may or may not supply electrical power to the battery to keep it charged. In such an embodiment, it would be possible to replace the battery through the rear face of the server housing. Also, the electrical cable 304 leading away from the battery emulator 310 would be routed to the power supply 210 at the rear of the housing. Thus, the power supply 210 would also serve as a battery housing.

Figure 6:
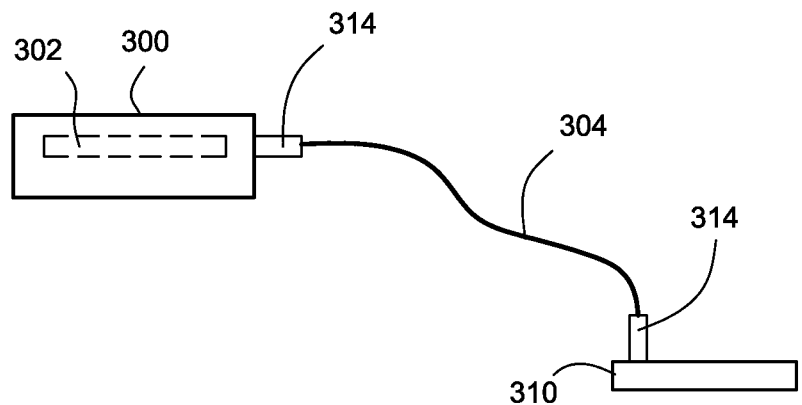
FIG. 6 illustrates another embodiment of a battery bypass assembly.

FIG. 6 illustrates an embodiment of a battery bypass assembly in which electrical connectors 314 are provided on opposite ends of the electrical cable 304. One connector 314 attaches to a corresponding connector on the battery housing 300, and the other connector 314 attaches to a corresponding connector on the battery emulator 310. Wires from the connector on the battery housing 300 would lead to the electrical contacts of a battery receptacle in the battery housing 300.

When the battery bypass assembly is configured as illustrated in FIG. 6, the battery bypass assembly can come in three main components—the battery housing 300, the cable 304 and the battery emulator 310. Different versions or variants of each element can be manufactured to conform to the individual requirement of different computers, laptop computers and computer servers. Any three of the main components could then be easily and quickly coupled together to provide a battery bypass assembly for a particular computer.

As explained above, the battery emulator 310 is configured to be received in the battery receptacle of a computer motherboard. The majority of commercial computers are designed to receive the same basic coin-shaped battery. However, different sized and shaped battery emulators can be manufactured to conform to the individual requirements of any computer.

The battery housing 300 could be mounted in many different locations, depending on the size and shape of the computer. As illustrated in FIGS. 4 and 5, a battery housing 300 could be designed to be mounted on the exterior or on the interior of a computer housing. As explained in more detail below, a battery housing could be designed to receive different types and shapes of batteries, and even different numbers of batteries. Further, some of the housings 300 might be designed to receive a non-replaceable capacitor, instead of a battery.

The cable could have different lengths, depending on where the battery emulator is to be installed, and where the battery housing is to be installed. Also, different types of connectors 314 could be provided on the ends of the cable 304. Preferably, the same type of connector would be used on both ends of the cable 304, for the sake of simplicity. However, certain situations may dictate that different types of connectors be installed on each end of the cable 304.

As explained above, one can then assemble a customized set of elements that are suited to any individual computer. One would select an appropriate battery emulator based on the type of battery receptacle present on the computer's motherboard. One would select an appropriate battery housing based on where it is to be mounted on the computer. One would also select a cable with an appropriate length and an appropriate set of connectors. The three main elements could then be installed on a computer to provide a battery bypass assembly.

In some instances, a computer motherboard might have an input connector instead of or in addition to a battery receptacle. The input connector would be used to supply electrical power to the same circuits of the motherboard as a battery in a battery receptacle. Thus, in some embodiments, only a battery housing 300 and an electrical cable 304 may be provided. The connector 314 at the end of the electrical cable would be configured to mate with the input connector on the computer motherboard. Thus, there would be no need to provide a separate battery emulator.

Figure 7:
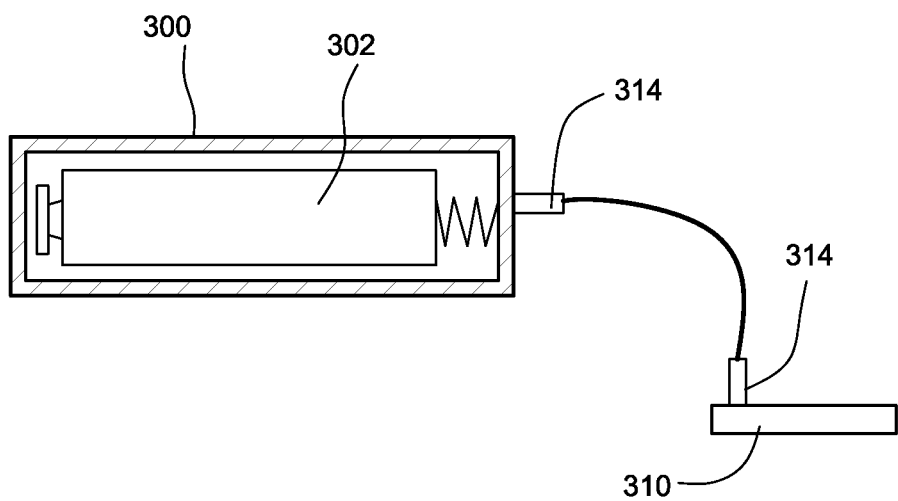
FIG. 7 illustrates another embodiment of a battery bypass assembly.

FIG. 7 illustrates another embodiment which includes a battery housing 300 designed to receive a different type of battery 302. In this embodiment, rather than receiving a coin-shaped battery, the battery housing 300 includes a receptacle designed to receive a cylindrical battery 302. Even if the battery receptacle on a computer's motherboard is designed to receive a coin-shaped battery, so long as the cylindrical battery provides power of a similar voltage, the cylindrical battery could be used to power the electrical circuits of the computer motherboard. Thus, while the battery emulator 310 is still designed to be inserted into a battery receptacle designed to receive a coin-shaped battery, the battery emulator 310 might actually be connected to a cylindrical shaped battery 302 in the battery housing 300. Accordingly, a battery bypass assembly need not connect the battery emulator 310 to a similarly shaped battery 302.

Figure 8:
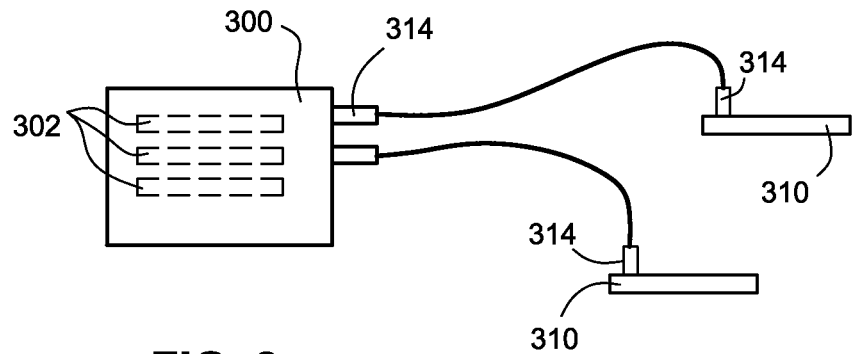
FIG. 8 illustrates another embodiment of battery bypass assembly.

FIG. 8 illustrates another embodiment of a battery bypass assembly. In this embodiment, the battery housing 300 receives a plurality of batteries 302. In some embodiments, all of the batteries 302 would be connected in parallel to the battery emulator 310. And because a plurality of batteries are used, instead of one, the batteries would likely last longer than a single battery would. Thus, providing a battery housing which holds a plurality of batteries that are all connected to the battery emulator can extend the time between battery replacements.

In other embodiments, only one of the batteries 302 in the battery housing 300 would be electrically coupled to the battery emulator 310. The other batteries mounted in the battery housing 300 would be spares. Thus, once the battery coupled to the battery emulator loses enough of its initial charge such that it can no longer power the clock circuits on a computer motherboard, maintenance personnel could replace the depleted battery with one of the spares that are already present in the battery housing 300. This would make it very convenient for maintenance personnel, because as soon as an error message indicating the original battery has lost its charge is issued, the maintenance personnel could immediately replace the depleted battery. There would be no need to spend any time or effort in locating a replacement battery.

FIG. 8 also illustrates that multiple battery emulators 310 could be connected to the same battery housing 300. When a single battery housing is coupled to multiple battery emulators 310, a single battery in the battery housing 300 could power all of the emulators. Alternatively, the battery housing could house multiple batteries, and each battery could be connected to a separate emulator. Also, multiple batteries could be connected in parallel to power all of the attached battery emulators.

Figure 9:
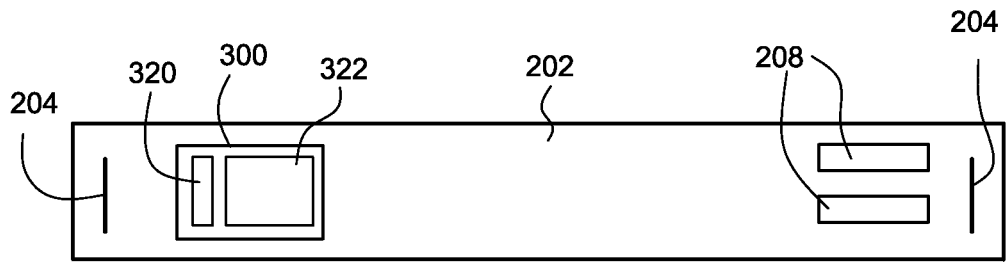
FIG. 9 illustrates a computer server having a battery bypass assembly with a solar cell module.

FIG. 9 shows the front face of a computer server 202 having a battery housing 300 mounted thereon. In this embodiment, the battery housing 300 includes both an aperture 320 to receive a battery, and a solar cell module 322. The solar cell module 322 is operatively connected to the contacts of the battery receptacle in the battery housing 300. Whenever the solar cell module produces electrical power in response to incident light, that electrical power is applied to the battery received in the battery housing to keep the battery charged. Thus, the provision of a solar cell module 322 could serve to keep the battery charged indefinitely.

Figure 10:
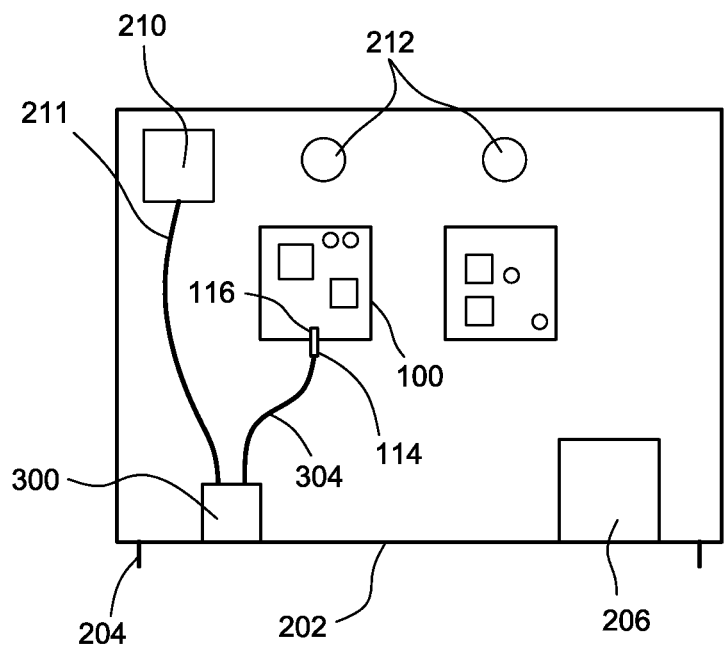
FIG. 10 illustrates a battery bypass assembly which is attached directly to a battery input connector on a computer motherboard.

FIG. 10 illustrates another embodiment of a battery bypass assembly. In this embodiment, no battery emulator is used. In this embodiment, the computer motherboard includes a battery input connector 116 which is designed to be coupled to a lead that extends from a coin-shaped battery module. With this type of a computer motherboard, the coin-shaped battery is not actually mounted in a battery receptacle on the computer motherboard. Instead, the electrical leads coming from a coin-shaped battery module are simply connected to the battery input connector 116 on the computer motherboard 100.

With this type of computer motherboard, there is no need to provide a separate battery emulator. Instead, the electrical connector 114 of the electrical cable 304 is connected directly to the battery input connector 116 on the computer motherboard 100.

As noted above, in yet other alternate embodiments, the battery housing could be replaced with a capacitor housing which includes a capacitor. In these embodiments, a power cable 211 from a power supply 210, or from a solar cell module 322, would be operatively connected to the capacitor to keep the capacitor charged. If power is lost for relatively short periods of time. The capacitor could provide the necessary electrical power required to run a clock circuit or memory circuits of a computer motherboard until power is restored. So long as power is restored before the capacitor is drained, the clock circuit and memory circuits of the computer motherboard would never stop operating.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A battery bypass assembly for a computer, comprising:
   a battery housing having a battery receptacle with electrical contacts that are configured to engage terminals of a battery that is installed in the battery receptacle;
   a battery emulator configured to be installed in a battery receptacle of a computer, the battery emulator including terminals that are configured to engage electrical contacts of a battery receptacle in which the battery emulator is installed; and
   an electrical cable that connects the electrical contacts of the battery receptacle in the battery housing to the terminals of the battery emulator.

2. The battery bypass assembly of claim 1, wherein the battery receptacle is configured to receive a coin-shaped battery.

3. The battery bypass assembly of claim 1, wherein the battery emulator is configured to be installed in a battery receptacle for a coin-shaped battery.

4. The battery bypass assembly of claim 1, wherein the cable includes a first connector that is configured to connect to a corresponding connector on the battery emulator.

5. The battery bypass assembly of claim 4, wherein the cable includes a second connector that is configured to connect to a corresponding connector on the battery housing.

6. The battery bypass assembly of claim 1, wherein the cable includes a first connector that is configured to connect to a corresponding connector on the housing.

7. The battery bypass assembly of claim 6, wherein the cable includes a second connector that is configured to attach to a battery terminal connector of a computer.

8. A computer comprising the battery bypass assembly of claim 1, wherein the battery emulator is installed in a battery receptacle of the computer.

9. The computer of claim 8, wherein the battery housing is mounted on a housing of the computer such that a battery can be inserted into and removed from the battery receptacle in the battery housing without opening the computer housing.

10. The computer of claim 9, wherein the battery housing is mounted on an exterior of the computer housing.

11. The computer of claim 9, wherein the battery housing is mounted inside the computer housing, and wherein an aperture in the computer housing allows a battery to be inserted into and removed from the battery housing.

12. The battery bypass assembly of claim 1, wherein the battery housing is configured to receive a plurality of batteries.

13. A rack-mountable computer server comprising the battery bypass assembly of claim 1, wherein the battery housing is mounted inside a front face of the rack-mountable computer server, and wherein an aperture in the front face of the rack-mountable computer server allows a battery to be inserted into and removed from the battery housing without removing the rack-mountable server from a rack in which it is mounted, and without opening a housing of the rack-mountable server.

14. The battery bypass assembly of claim 1, further comprising a power input on the battery housing, wherein the power input is coupled to the electrical contacts in the battery receptacle such that when power is applied to the power input from an external power source, the power will be coupled to a battery mounted in the battery receptacle to keep the battery charged.

15. The battery bypass assembly of claim 1, further comprising a solar cell module, wherein electrical output leads of the solar cell are coupled to the electrical contacts in the battery receptacle such that when electrical power is generated by the solar cell, the electrical power will be coupled to a battery mounted in the battery receptacle to keep the battery charged.

16. A battery bypass assembly for a computer, comprising:
    a housing;
    a capacitor mounted in the housing;
    a battery emulator configured to be installed in a battery receptacle of a computer, the battery emulator including terminals that are configured to engage electrical contacts of a battery receptacle in which the battery emulator is installed; and
    an electrical cable that operatively connects the capacitor to the terminals of the battery emulator.

17. The battery bypass assembly of claim 16, further comprising a power input on the housing, wherein the power input is coupled to the capacitor such that when power is applied to the power input from an external power source, the power will be coupled to the capacitor to keep the capacitor charged.

18. A method of retro-fitting a computer with a battery bypass assembly, comprising:
    attaching a battery housing to a housing of the computer, the battery housing having a battery receptacle with electrical contacts that are configured to engage terminals of a battery that is installed in the battery receptacle;
    operatively connecting a first end of an electrical cable to the electrical contacts of the battery receptacle;
    operatively connecting a second end of the electrical cable to terminals of a battery emulator that is configured to be installed in a battery receptacle of a computer; and
    installing the battery emulator in a battery receptacle of the computer.

* * * * *